US012666663B2

(12) United States Patent
Han et al.

(10) Patent No.:  US 12,666,663 B2
(45) Date of Patent:       Jun. 23, 2026

(54) PILLAR STRUCTURE AND SUPER JUNCTION SEMICONDUCTOR DEVICE INCLUDING THE SAME

(71) Applicant: DB HITEK CO., LTD., Seoul (KR)

(72) Inventors: Yong Sin Han, Jeonju-si (KR);
Myeong Bum Pyun, Namdong-gu (KR)

(73) Assignee: DB HITEK CO., LTD., Seoul (KR)

( * ) Notice:   Subject to any disclaimer, the term of this patent is extended or adjusted under 35 U.S.C. 154(b) by 557 days.

(21) Appl. No.: 18/096,221

(22) Filed:     Jan. 12, 2023

(65)              Prior Publication Data

US 2023/0223435 A1      Jul. 13, 2023

(30)        Foreign Application Priority Data

Jan. 13, 2022     (KR) ........................ 10-2022-0005464

(51) Int. Cl.
*H10D 62/10*          (2025.01)
*H10D 30/63*          (2025.01)
*H10D 64/00*          (2025.01)
(52) U.S. Cl.
CPC ........... *H10D 62/111* (2025.01); *H10D 30/63* (2025.01); *H10D 62/126* (2025.01); *H10D 64/111* (2025.01)
(58) Field of Classification Search
CPC .... H10D 30/63; H10D 62/126; H10D 64/111; H10D 30/665; H10D 62/393; H10D 64/112; H10D 62/106; H10D 64/511; H10D 62/109–111; H10D 84/016; H10D 84/0195; H10B 63/34
See application file for complete search history.

(56)                References Cited

U.S. PATENT DOCUMENTS

2019/0305088 A1    10/2019   Bobde et al.
2022/0069075 A1*    3/2022   Lee .................... H10D 30/0291

FOREIGN PATENT DOCUMENTS

CN        204857728 U   * 12/2015
KR     1020130022798 A    3/2013
KR       20200105350 A   * 9/2020   ............. H10D 30/00
KR     1020200105350       9/2020

OTHER PUBLICATIONS

Office Action dated Jun. 27, 2023 from the Korean Intellectual Property Office (KIPO) in connection with the Korean Patent Application No. 10-2022-0005464, 7 pages.
English summary of Office Action dated Jun. 27, 2023 from the Korean Intellectual Property Office (KIPO) in connection with the Korean Patent Application No. 10-2022-0005464, 6 pages.

* cited by examiner

*Primary Examiner* — Shahed Ahmed
(74) *Attorney, Agent, or Firm* — Husch Blackwell

(57)                ABSTRACT

A pillar structure includes an epitaxial layer of a first conductivity type including an active region and a peripheral region surrounding the active region and a plurality of pillars of a second conductivity type, the pillars extending in a vertical direction within the epitaxial layer, being spaced apart from each other in a horizontal direction, respectively, and including active pillars provided in the active region and peripheral pillars provided in the peripheral region, wherein the active pillars are spaced apart from another adjacent each other at a first pitch, and a pair of the peripheral pillars are branched from one of the active pillars and are spaced apart from each other at a second pitch smaller than the first pitch.

19 Claims, 5 Drawing Sheets

PILLAR STRUCTURE AND SUPER JUNCTION SEMICONDUCTOR DEVICE INCLUDING THE SAME

CROSS-REFERENCE TO RELATED APPLICATION

This application claims priority to Korean Patent Application No. 10-2022-0005464, filed on Jan. 13, 2022 and all the benefits accruing therefrom under 35 U.S.C. § 119, the contents of which are incorporated by reference in their entirety.

TECHNICAL FIELD

The present disclosure relates to a pillar structure and a super junction semiconductor device including the same, and more particularly, to a pillar structure having a P-N junction along a vertical direction and a super junction semiconductor including a pillar structure and a metal oxide semiconductor field effect transistor (hereinafter, referred to as MOSFET).

BACKGROUND

Generally, a super junction semiconductor device having a super junction structure has been widely used in order to improve a trade-off relation between forward characteristics and reverse characteristics in a power semiconductor device.

The super junction semiconductor device includes a substrate defining an active region, a peripheral region surrounding the active region, and a transition region interposed between the active region and the peripheral region. Further, the super junction semiconductor includes a plurality of cell in the active region, each having a plurality of N-type pillars spaced apart from each other, a plurality of P-type pillars spaced apart from each other to be alternatively arranged, a P-body region and a plurality of gate structures, and a termination ring entirely surrounding an active region to define a peripheral region. Therefore, the super junction semiconductor device has a relatively low on-resistance $R_{sp}$ to decrease a size of the semiconductor device. As a result, the super junction semiconductor device has a reduced capacitance to improve the switching characteristics thereof. Furthermore, as a constant electric field is maintained throughout the pillar structure, characteristics having a relatively high breakdown voltage value may be implemented.

However, in the super junction semiconductor device, a high electric field may be locally formed on each top of the pillars included in the pillar structure. As a result, a theoretically calculated breakdown voltage value cannot be implemented, thus, which could not help having a low-level breakdown voltage characteristic. In particular, the super junction semiconductor device may have a serious problem of non-uniform electric field formation which may occur on the top of each of the pillars located in a peripheral area.

SUMMARY

The example embodiments of the present disclosure provide a pillar structure capable of mitigating a local electric concentration to uniformly forming an overall electric field.

The example embodiments of the present disclosure provide a super junction semiconductor device including a pillar structure capable of mitigating a local electric concentration to uniformly forming an overall electric field.

According to some example embodiments of the present disclosure, a pillar structure includes an epitaxial layer of a first conductivity type including an active region and a peripheral region surrounding the active region and a plurality of pillars of a second conductivity type, the pillars extending in a vertical direction within the epitaxial layer, being spaced apart from each other in a horizontal direction, respectively, and including active pillars provided in the active region and peripheral pillars provided in the peripheral region, wherein the active pillars are spaced apart from another adjacent each other at a first pitch, and a pair of the peripheral pillars are branched from one of the active pillars and are spaced apart from each other at a second pitch smaller than the first pitch.

In an example embodiment, the peripheral region may have an elliptical band shape, and the pair of the peripheral pillars may be arranged selectively in a longitudinal region of the peripheral region.

In an example embodiment, the second pitch may be ½ times the first pitch.

Here, the upper peripheral pillar portion may have a second width being ½ times a first width of each of the active pillars.

In an example embodiment, the pair of upper peripheral pillar and the one of the active pillars may be connected to one another in a "Y" shape or a 'C' shape when viewed in a plan view.

In an example embodiment, each of the active pillars may include a plurality of active cells stacked in the vertical direction.

Here, each of the active cells may have a first diameter of a spherical shape.

Further, each of the peripheral pillars includes a lower peripheral portion having a plurality of lower peripheral cells stacked in the vertical direction, each having the first diameter of the spherical shape, and an upper peripheral porting having a plurality of upper peripheral cells being connected to a topmost one of the lower peripheral cells, each having a second diameter of spherical shape smaller than the first diameter.

According to some example embodiments of the present disclosure, a super junction semiconductor device includes a substrate of a first conductive type, the substrate including an active region, a peripheral region surrounding the active region and a transition region interposed between the active region the peripheral region, an epitaxial layer disposed on the substrate, the epitaxial layer having the first conductive type, a plurality of pillars extending in a vertical direction, each being spaced apart from each other in a horizontal direction within the epitaxial layer, and including active pillars provided in the active region and peripheral pillars provided in the peripheral region, gate structures disposed on the epitaxial layer in the active region, and each extending across the epitaxial layer and the pillars in a horizontal direction, and a gate pad disposed on the epitaxial layer in the transition region, and being electrically connected to the gate structures, wherein the active pillars are spaced apart from another adjacent each other at a first pitch, and a pair of the peripheral pillars are branched from one of the active pillars and are spaced apart from another adjacent each other at a second pitch smaller than the first pitch.

In an example embodiment, the peripheral region has an elliptical band shape, and a plurality of upper peripheral pillar portion is arranged in the second pitch and selectively in a longitudinal region of the peripheral region.

In an example embodiment, the second pitch is ½ times the first pitch.

In an example embodiment, the upper peripheral pillar portion has a second width being smaller than a first width of each of the active pillars.

In an example embodiment, the second width is ½ times the first width of each of the active pillars.

In an example embodiment, a pair of the upper peripheral pillar portions and an upper portion of one of the active pillars are connected to one another to form a "Y" shape when viewed in a plan view.

In an example embodiment, a pair of the upper peripheral pillar portions and an upper portion of one of the active pillars are connected to one another to form a "C" shape when viewed in a plan view.

In an example embodiment, each of the active pillars includes a plurality of active cells stacked in the vertical direction.

Here, each of the active cells has a first diameter of a spherical shape.

Further, each of the peripheral pillars includes a plurality of lower peripheral cells stacked in the vertical direction, each having of a first diameter of a spherical shape, and a plurality of upper peripheral cells being connected to a topmost one of the lower peripheral cells, each having a second diameter of spherical shape smaller than the first diameter.

Furthermore, the upper peripheral cells are stacked at least with two cells.

According to an example embodiment of the present disclosure, a super junction semiconductor device includes the pillar structure having the active pillars are spaced apart from another adjacent each other at a first pitch, and a pair of the peripheral pillar are branched from one of the active pillars and are spaced apart from each other at a second pitch smaller than the first pitch.

The peripheral pillar may alleviate an upper electric field concentrated in the peripheral region. In particular, the peripheral pillar of a P-type conductivity may have a relatively high P/N ratio in the peripheral region with respect to the active region. Accordingly, electric field concentration, which may occur in the peripheral region may be alleviated.

Accordingly, the super junction semiconductor device may have improved breakdown voltage characteristics. The peripheral pillars are selectively arranged at the second pitch within the longitudinal region of the peripheral region, whereas both the peripheral pillars and the active pillars are arranged at the same first pitch within the unidirectional region of the peripheral region

BRIEF DESCRIPTION OF THE DRAWINGS

Example embodiments can be understood in more detail from the following description taken in conjunction with the accompanying drawings, in which:

FIG. 3 is a cross sectional view illustrating a transition region TR in FIG. 1;

FIG. 8 is a cross sectional view illustrating an example of the peripheral pillars in FIG. 4.

DETAILED DESCRIPTION OF EMBODIMENTS

Figure 1:
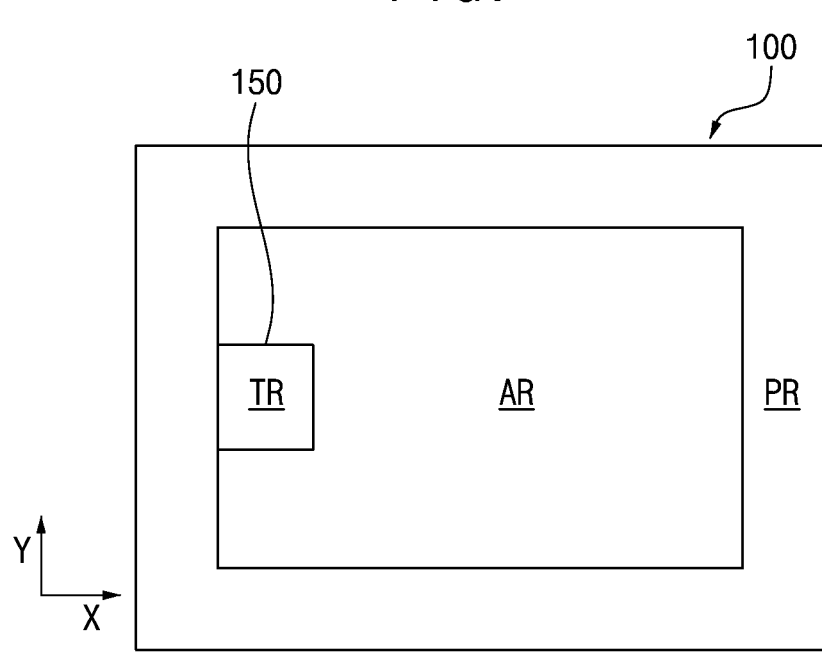
FIG. 1 is a plan view illustrating a super junction semiconductor device in accordance with an example embodiment of the present disclosure.

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, regions, or plates may also be present. By contrast, it will also be understood that when a layer, a film, a region or a plate is referred to as being 'directly on' another one, it is directly on the other one, and one or more intervening layers, films, regions or plates do not exist. Also, though terms such as a first, a second, and a third are used to describe various components, compositions, regions, films, and layers in various embodiments of the present disclosure, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations. As used throughout the description and the claims, "above" and "below" refer to a device as oriented in the drawings. That is, "bottom" or "below" or "under" refers to the portions that are towards the bottom of the page and towards the unaltered substrate portion, whereas "top" or "over" or "above" refers to the portions that are towards the top of the page (that is, towards the portion of the structures that is operated upon with various treatments to form the electrically active components thereof). Such terms are used either on an absolute basis or relative to other components, and the meaning of such relative terminology will be understood in reference to the drawings.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. The Figures are not necessarily drawn to scale. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present invention.

Figure 2:
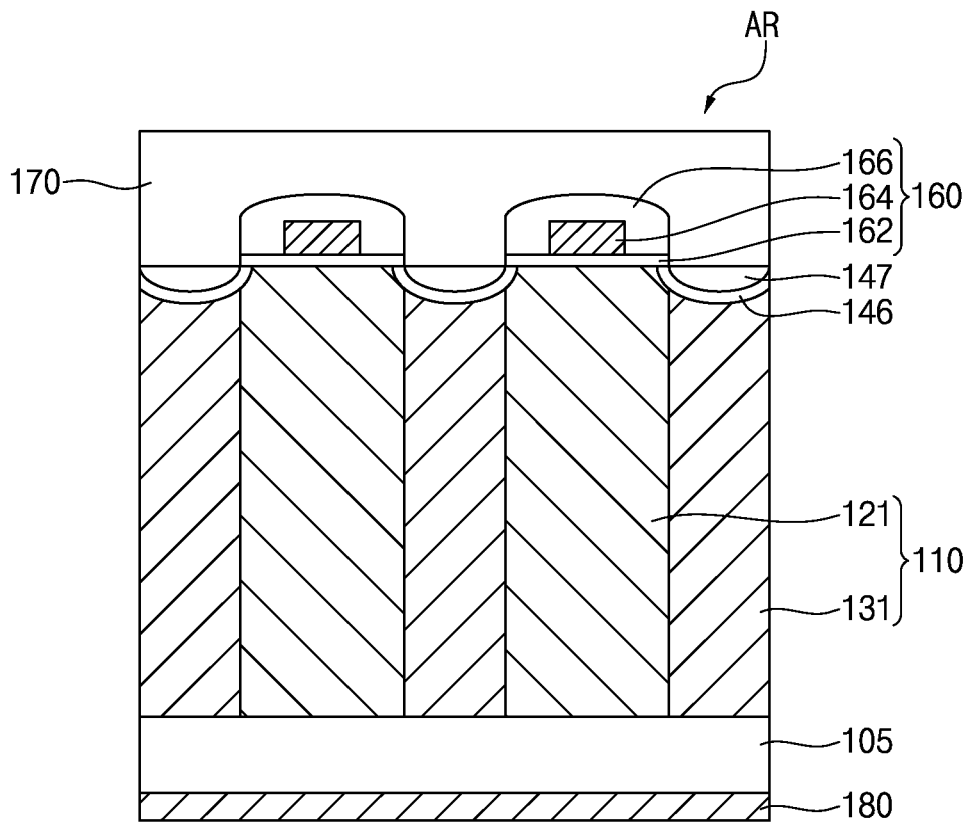
FIG. 2 is a cross sectional view illustrating an active region AR in FIG. 1.
Figure 3:
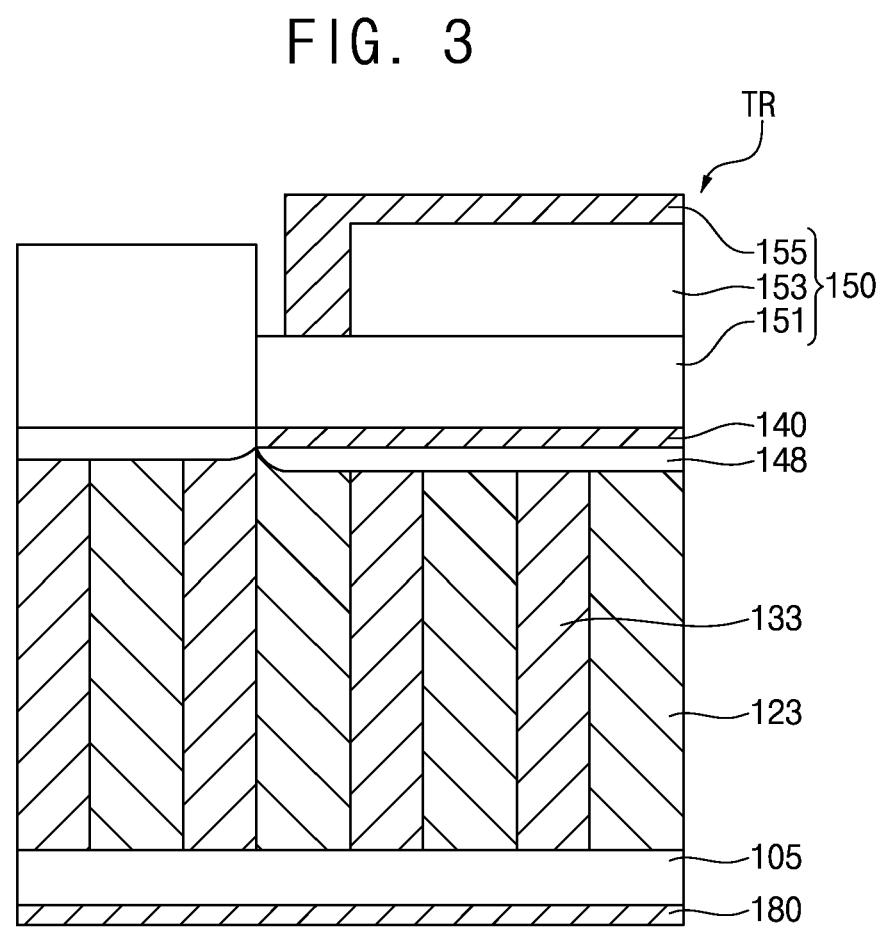
Figures 4, 5:
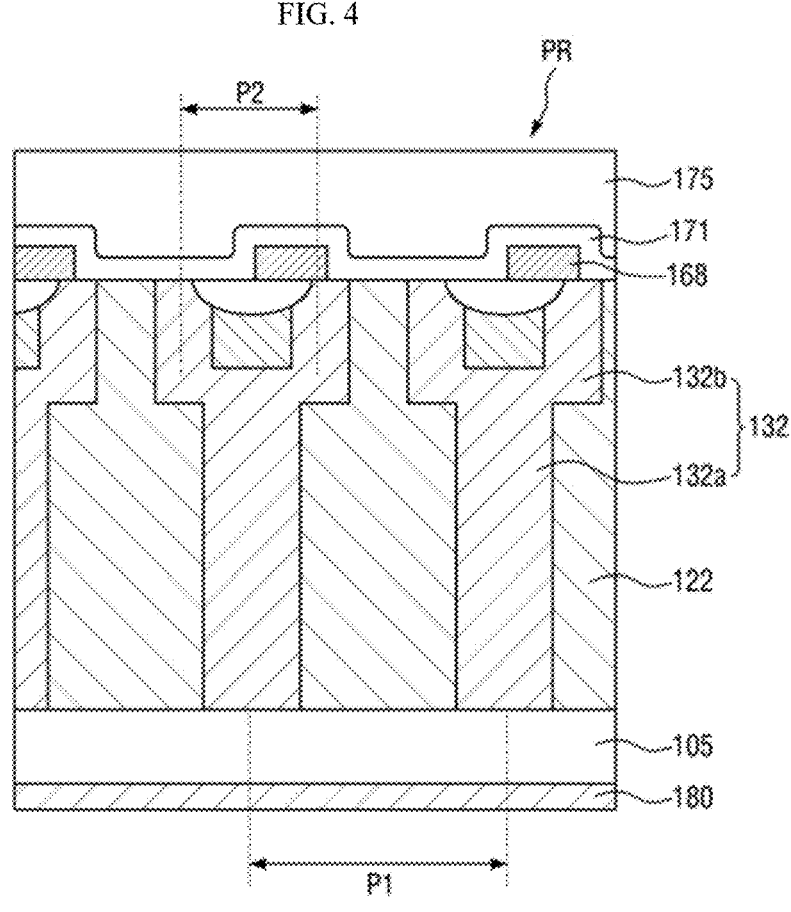
FIG. 4 is a cross sectional view illustrating a peripheral region PR in FIG. 1.
FIG. 5 is a plan view illustrating an example of the pillar structure in FIG. 1.

FIG. 1 is a plan view illustrating a super junction semiconductor device in accordance with an example embodiment of the present disclosure. FIG. 2 is a cross sectional view illustrating an active region AR in FIG. 1. FIG. 3 is a cross sectional view illustrating a transition region TR in FIG. 1. FIG. 4 is a cross sectional view illustrating a peripheral region PR in FIG. 1. FIG. 5 is a plan view illustrating an example of the pillar structure in FIG. 1.

Referring to FIGS. 1 to 5, a super junction semiconductor device 100 in accordance with an example embodiment of the present disclosure includes a substrate 105, a pillar structuring having an epitaxial layer 120 and a plurality of pillars 130, gate structures 160, a source electrode 170 and a reverse recovery layer 140.

The substrate 105 may include a silicon substrate. The substrate 105 has a first conductive type, for example, a high concentration conductive N+ type.

The substrate 105 is divided into an active region AR, a peripheral region PR, and a transition region TR. The active region AR is disposed in a central portion of the semiconductor device. A power MOSFET is formed in the active region AR. The peripheral region PR is provided to surround the active region AR. Meanwhile, the transition region TR is defined as a boundary region between the active region AR and the peripheral region PR.

The pillar structure 110 is disposed over the substrate 105. The pillar structure 110 includes an epitaxial layer 120 and the pillars 130. The pillar structure 110 may be formed in all of the active region AR, the peripheral region PR, and the transition region TR.

The epitaxial layer 121, 122 and 123 has the first conductive type, for example, a low concentration conductive N-type. The epitaxial layer 121, 122 and 123 may be formed from the substrate 105 by an epitaxial growth process. The epitaxial layer 121, 122 and 123 is formed entirely on an upper portion of the substrate 105 including the active region AR, the peripheral region PR, and the transition region TR. Further, the epitaxial layer 121, 122 and 123 may include an active epitaxial layer 121, a peripheral epitaxial layer 122 and a transition epitaxial layer 120 formed in the active region AR, the peripheral region PR and the transition region TR, respectively.

The pillars 131, 132 and 133 extend in a vertical direction inside the epitaxial layer 121, 122 and 123, respectively. The pillars 131, 132 and 133 may be formed to vertically penetrate the epitaxial layer 121, 122 and 123, respectively. The pillars 131, 132 and 133 may have a second conductivity type. That is, when the epitaxial layer 121, 122 and 123 has an n-type conductivity, each of the pillars 131, 132 and 133 may have a p-type conductivity. The pillar 131, 132 and 133 is formed entirely on an upper portion of the substrate 105 including the active region AR, the peripheral region PR, and the transition region TR. Further, the pillar 131, 132 and 133 may include an active epitaxial layer 121, a peripheral epitaxial layer 122 and a transition epitaxial layer 120 formed in the active region AR, the peripheral region PR and the transition region TR, respectively.

Also, the pillars 131, 132 and 133 may be alternately arranged along a horizontal direction. That is, the pillars 131, 132 and 133 are arranged to be spaced apart from each other in the horizontal direction. Accordingly, each of the pillars 131, 132 and 133 and the epitaxial layer 130 may be alternately arranged with one another.

A P-body region 146 is provided at an upper portion of the active pillars 131. In addition, a high concentration region 147 of the second conductivity type is provided in the upper portion of the P-body region 146. Accordingly, since the P-body region 146 and the high concentration region 147 have relatively low resistance, such that an electrical connection between the active pillars 131 and the source electrode 190 may be stably secured.

The gate structures 160 are provided on the epitaxial layer 121 in the active region AR. Each of the gate structures 160 formed in the active region extends in a horizontal direction across the active epitaxial layer 121. Each of the gate structures 160 may have a stripe shape. The gate structures 160 are arranged to be spaced apart from each other. Further, in a plan view, when each of the active epitaxial layers 121 has a hexagonal shape, each of the gate structures 160 extends between the active epitaxial layers 121 adjacent to each other.

Since each of the gate structures 160 has a stripe shape, a width of each of the gate structures 160 is relatively narrow, so that the super-junction semiconductor device 100 may have reduced input capacitance.

Each of the gate structures 160 formed in the active region includes a gate insulating layer 162, a gate electrode 164, and a hard mask layer 166.

The gate insulating layer 162 is provided to extend across the active epitaxial layers 121. An example of the gate insulating layer 162 may include a silicon oxide layer.

The gate electrode 164 is positioned on the gate insulating layer 162. A width of the gate electrode 164 may be narrower than the width of the gate insulating layer 162. An example of the gate electrode 164 may include polysilicon material.

The hard mask layer 166 is provided to cover the gate electrode 164 and the gate insulating layer 162. The hard mask layer 166 electrically insulates the gate electrode 164 and the source electrode 190 from each other. An example of the hard mask layer 166 includes a nitride layer.

Although not shown, each of the gate structures 160 may have a trench structure. In this case, each of the gate structures 160 is formed to extend into the active epitaxial layer 121. Since a gap between the active pillars 131 may be reduced, forward characteristics may be improved according to the improvement in the degree of integration of the super-junction semiconductor device 100.

Referring to FIG. 3, the gate pad part 150 is provided on the transition epitaxial layer 123 and the transition pillars 133 and in the transition region TR. The gate pad part 150 is electrically connected to the gate structures 160. The gate pad part 150 may be electrically connected to, for example, the gate electrode 164 included in each of the gate structures 160.

The gate pad part 150 may include a field oxide layer 151, an insulating interlayer 153 and a gate pad 155 provided on the transition epitaxial layer 133.

The field oxide layer 151 is provided on the transition epitaxial layer 123 in the transition region TR. The field oxide layer 151 may electrically isolate the transition region from the active region by oxidizing the epitaxial layer 120.

The insulating interlayer 153 is provided to cover the field oxide layer 151. The interlayer insulating layer 153 electrically insulates the gate pad part 150 from other components.

The gate pad 155 is provided on a portion of the field oxide layer 151 exposed by the insulating interlayer 153 and on the interlayer insulating layer 153.

The gate pad 155 is electrically connected to the gate electrode 164 provided in the active region AR.

A transition epitaxial layer 123 and transition pillar 133 are also provided in the transition region TR where the gate pad portion 150 is formed.

The reverse recovery layer 140 is located under the gate pad part 150. The reverse recovery layer 140 is provided in the transition region TR. The reverse recovery layer 140 may correspond to the transition region TR and may have an area identical to that of the gate pad part 150.

Alternatively, the reverse recovery layer 140 is formed on the transition pillars 133 and on the transition epitaxial layer 123.

The reverse recovery layer 140 may have a second conductivity type, for example, a P-type conductivity. The reverse recovery layer 140 may be formed by ion implantation of an impurity element such as a group III element, for example, boron, gallium, or indium. In this case, in the ion implantation process, the reverse recovery layer 140 may be adjusted to have various profiles by changing a processing time, an ion implantation amount, or an ion implantation energy condition.

The reverse recovery layer 140 may be formed in the transition region TR to effectively dissipate the reverse recovery current.

That is, when the super junction semiconductor device 100 is switched from an on-state to an off-state, a reverse recovery phenomenon may occur. In particular, the reverse recovery phenomenon can be severe at the transition region TR. When a reverse recovery current $I_{sd}$ is concentrated in a boundary region between the transition region TR and the peripheral region PR, the reverse recovery current $I_{sd}$ may flow along the reverse recovery layer 140 to reduce a resistance value of the reverse recovery current $I_{sd}$. Thus, the reverse recovery layer 140 may suppress the lattice temperature from increasing. As a result, a burnt phenomenon around the boundary region may be suppressed.

Referring again to FIG. 2, the source electrode 170 is provided on the epitaxial layer 121 to cover the gate structures 160. Meanwhile, a drain electrode 180 is formed on the lower surface of the substrate 110.

Referring again to FIGS. 2 & 3, a diffusion region 148 may be additionally provided in the transition region TR and over the transition pillar 133. A horizontal end portion of the diffusion region 148 may be bridged to the first active pillar 131 of the active region AR. Accordingly, the diffusion region 148 may connect the transition pillars 133 in the transition region TR to one of the active pillars 131 provided in the active region AR. As a result, the transition pillar 133 may be connected to the source electrode 170 via the diffusion region 148 and the active pillar 131.

Further, the diffusion region 148 is formed across the transition pillars 133 and the upper portion of the transition epitaxial layer 123 in the transition region TR. In this case, the transition region TR may be defined by the width of the diffusion region 148.

The diffusion region 148 in the transition region TR may have a doping concentration similar to that of the P-body region 146 in the active region.

Meanwhile, the reverse recovery layer 140 may have the ion concentration higher than that of the diffusion region 148. Accordingly, when the reverse recovery current Isd flows, the reverse recovery layer 140 formed in the transition region TR may effectively makes a resistance of the reverse recovery current lower.

Referring again to FIGS. 4 and 5, the peripheral epitaxial layer 122 and the peripheral pillars 132 are provided in the peripheral region PR.

Each of the peripheral pillars 132 may branch off from the active pillar 131 to form a pair of peripheral pillars 132. The active pillars 131 are spaced apart from each other and adjacent to each other at a first pitch P1, whereas a pair of peripheral pillars 132 is spaced apart from another at a second pitch P2 smaller than the first pitch P1. The peripheral pillars 132 may alleviate an upper electric field concentrated in the peripheral region PR. In particular, the peripheral pillars 132 of the P-type conductivity may have a relatively high P/N ratio compared to that of the active region AR. Accordingly, electric field concentration phenomena which may occur at the peripheral region PR may be alleviated. As a result, the super junction semiconductor device 100 may have improved breakdown voltage characteristics.

When the peripheral region PR has an elliptical band shape, the peripheral region PR includes a longitudinal region and a unidirectional region. The pair of peripheral pillars 132 is arranged in the second pitch and selectively in the longitudinal region of the peripheral region. On the other hand, a plurality of the peripheral pillars, which are formed in the unidirectional region of the peripheral regions PR, are arranged in the first pitch as the active pillars are arranged.

In an example embodiment of the present disclosure, the second pitch P2 is ½ times the first pitch P1. Further, each of the peripheral pillars 132 has a second width, ½ times a first width of the active pillar 131. Accordingly, the peripheral pillars 132 may be uniformly arranged in the peripheral region PR.

In an example embodiment of the present disclosure, the pair of the peripheral pillar portions 132 and the active pillar 131 may be interconnected in a "Y" shape when viewed in a plan view.

Figure 6:
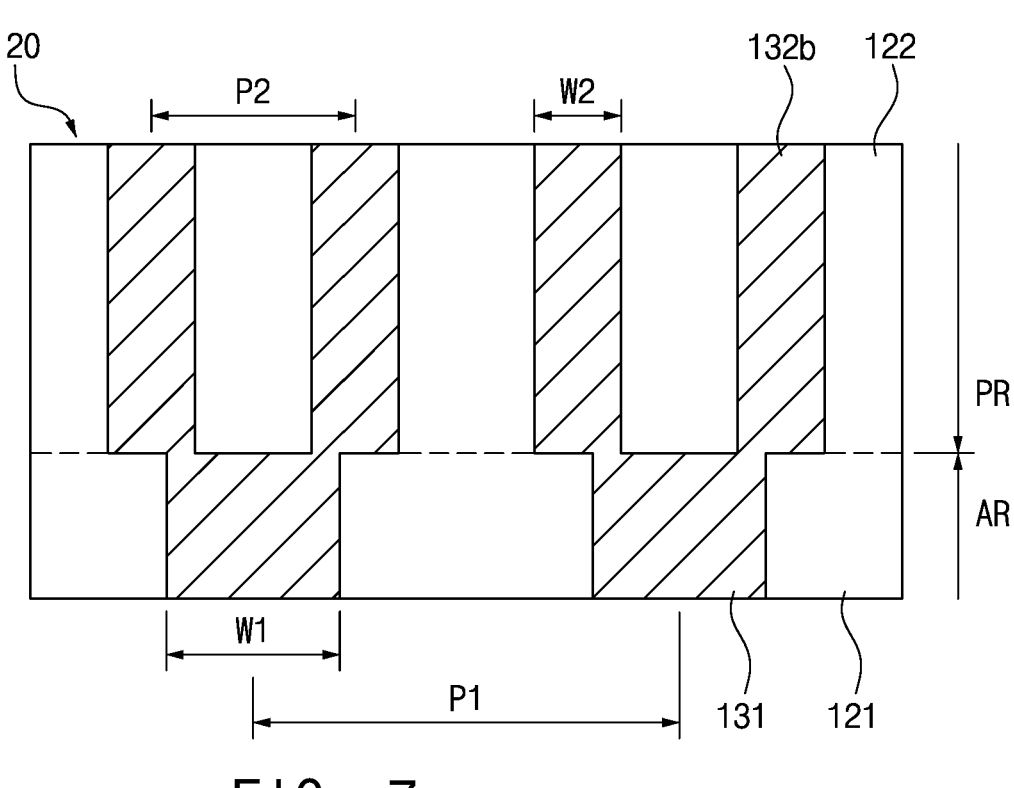
FIG. 6 is a plan view illustrating another example of the pillar structure in FIG. 1.

FIG. 6 is a plan view illustrating another example of the pillar structure in FIG. 1.

Referring to FIG. 6, the pair of the peripheral pillars 132b and the active pillar 131 may be interconnected to one another to form a "C" shape when viewed in a plan view.

Referring again to FIG. 4, a field plate electrode 168 is formed in the peripheral region PR. The field plate electrode 168 may electrically have a floating state. Accordingly, the field plate electrode 168 is also referred to as a dummy electrode.

The field plate electrode 168 may be made of, for example, a polysilicon material. Further, an insulating interlayer 171 is formed to cover the filed plate electrode 168. A surface passivation layer 175 covering the insulating interlayer 171 is further formed.

Meanwhile, as described above, the peripheral epitaxial layers 122 and the peripheral pillars 132 extend in the vertical direction and in the peripheral region PR. In addition, the peripheral epitaxial layers 122 and the peripheral pillars 132 may be alternately arranged.

As the field plate electrode 168 is provided in the peripheral region PR, the electric field concentration is alleviated, and the breakdown voltage may increase so that the super junction semiconductor device 100 may have improved breakdown voltage.

Figure 7:
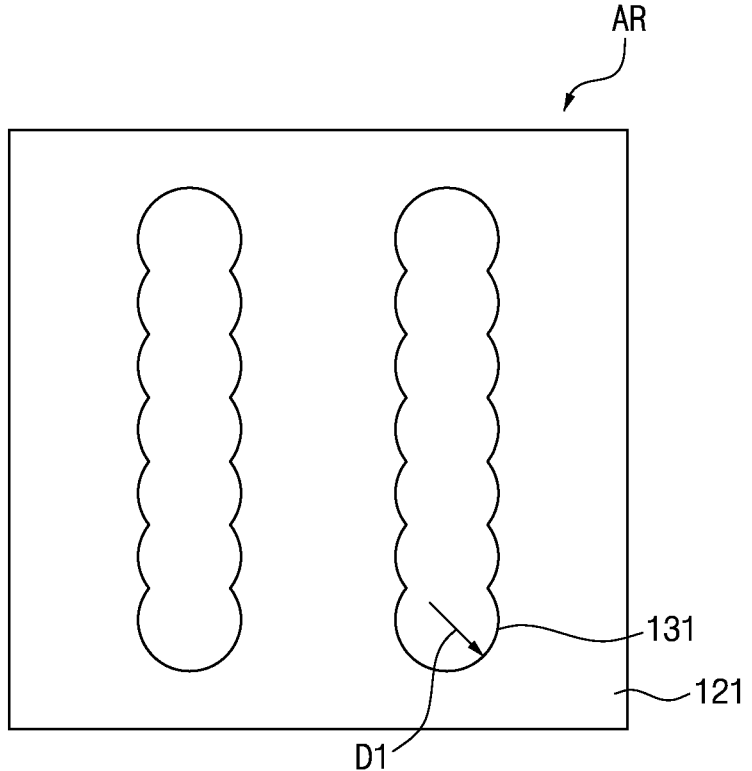
FIG. 7 is a cross sectional view illustrating an example of the active pillars in FIG. 2.
Figure 8:
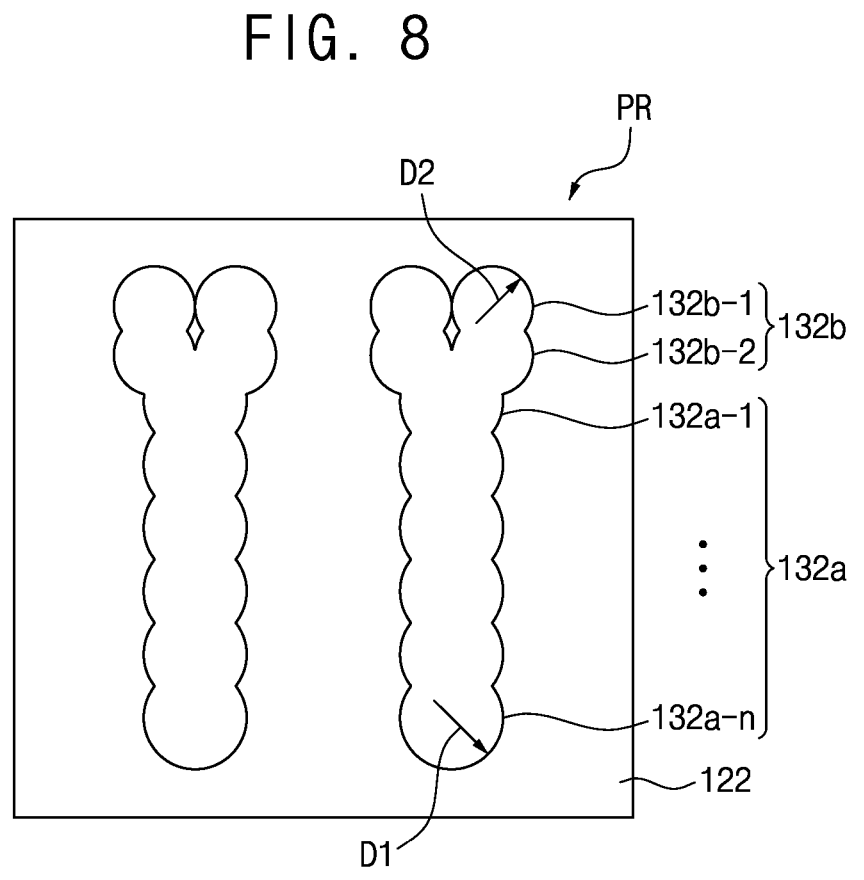

FIG. 7 is a cross sectional view illustrating an example of the active pillars in FIG. 2. FIG. 8 is a cross sectional view illustrating an example of the peripheral pillars in FIG. 4.

Referring to FIG. 7, the active pillar 131 may include a plurality of active cells that are vertically stacked and connected as a whole. That is, each of the active cells may have substantially a spherical shape. The active cells may be stacked in a vertical direction and connected to one another.

In this case, each of the active cells, which is provided in the active region AR and has a spherical shape, may have a first diameter D1.

Referring to FIG. 8, each of peripheral cells formed in the peripheral region PR includes both a lower peripheral portion 132a having lower peripheral cells 132a-1 to 132a-n each having a spherical shape having the first diameter D1, and an upper peripheral portion 132b having upper peripheral cells, for example, a pair of upper peripheral cells 132b-1 to 132b-2.

The lower peripheral portion 132a is connected to two upper peripheral portions 132b

The upper peripheral cells 132*b*-1 may have a second diameter D2 smaller than the first diameter D1. Furthermore, the upper peripheral portion may have at least two layers stacked in a vertical direction.

As described above, example embodiments of the pillar structures may be implemented into the super junction semiconductor device.

Although the super junction semiconductor device has been described with reference to the specific embodiments, they are not limited thereto. Therefore, it will be readily understood by those skilled in the art that various modifications and changes can be made thereto without departing from the spirit and scope of the appended claims.

The invention claimed is:

1. A pillar structure comprising:
an epitaxial layer of a first conductivity type including an active region and a peripheral region surrounding the active region; and
a plurality of pillars of a second conductivity type, the pillars extending in a vertical direction within the epitaxial layer, being spaced apart from each other in a horizontal direction, respectively, and including active pillars provided in the active region and peripheral pillars provided in the peripheral region,
wherein the peripheral pillars comprise lower peripheral pillars arranged at a first pitch, and a pair of upper peripheral pillars,
wherein the pair of upper peripheral pillars are branched from one of the lower peripheral pillars and are spaced apart from each other at a second pitch,
wherein the second pitch is smaller than the first pitch and is maintained constant in the vertical direction.

2. The pillar structure of claim 1, wherein the peripheral region has an elliptical band shape, and the pair of the peripheral pillars are arranged selectively in a longitudinal region of the peripheral region.

3. The pillar structure of claim 1, wherein the second pitch is ½ times the first pitch.

4. The pillar structure of claim 3, wherein the upper peripheral pillar portion has a second width being ½ times a first width of each of the active pillars.

5. The pillar structure of claim 1, wherein the pair of the peripheral pillars and the one of
the active pillars are connected to one another in a "Y" shape when viewed in a plan view.

6. The pillar structure of claim 1, wherein each of the active pillars includes a plurality of spherical filler cells having a first diameter.

7. The pillar structure of claim 6, wherein each of the active cells has a first diameter of a spherical shape.

8. The pillar structure of claim 7, wherein each of the peripheral pillars includes a lower 10 peripheral portion having a plurality of lower peripheral cells stacked in the vertical direction, each having the first diameter of the spherical shape, and an upper peripheral porting having a plurality of upper peripheral cells being connected to a topmost one of the lower peripheral cells, each having a second diameter of spherical shape smaller than the first diameter.

9. A super junction semiconductor device comprising:
a substrate of a first conductive type, the substrate including an active region, a peripheral region surrounding the active region and a transition region interposed between the active region the peripheral region;

an epitaxial layer disposed on the substrate, the epitaxial layer having the first 20 conductive type;
a plurality of pillars extending in a vertical direction, each being spaced apart from each other in a horizontal direction within the epitaxial layer, and including active pillars
provided in the active region and peripheral pillars provided in the peripheral region;
gate structures disposed on the epitaxial layer in the active region, and each extending across the epitaxial layer and the pillars in a horizontal direction; and
a gate pad disposed on the epitaxial layer in the transition region, and being electrically connected to the gate structures,
wherein the peripheral pillars comprise lower peripheral pillars arranged at a first pitch, and a pair of upper peripheral pillars,
wherein the pair of upper peripheral pillars are branched from one of the lower peripheral pillars and are spaced apart from each other at a second pitch,
wherein the second pitch is smaller than the first pitch and is maintained constant in the vertical direction.

10. The super junction semiconductor device of claim 9, wherein the peripheral region has an elliptical band shape, and a plurality of upper peripheral pillar portion is arranged in the second pitch and selectively in a longitudinal region of the peripheral region.

11. The super junction semiconductor device of claim 9, wherein the second pitch is ½ times the first pitch.

12. The super junction semiconductor device of claim 9, wherein the upper peripheral pillar portion has a second width being smaller than a first width of each of the active pillars.

13. The super junction semiconductor device of claim 9, wherein the second width is ½ times the first width of each of the active pillars.

14. The super junction semiconductor device of claim 9, wherein the pair of the peripheral pillars and the one of the active pillars are connected to one another in a "Y" shape when viewed in a plan view.

15. The super junction semiconductor device of claim 9, wherein the pair of the 5 peripheral pillar and the one of the active pillars are connected to one another in a 'C" shape when viewed in a plan view.

16. The super junction semiconductor device of claim 9, wherein each of the active pillars includes a plurality of active cells stacked in the vertical direction.

17. The super junction semiconductor device of claim 16, wherein each of the active cells has a first diameter of a spherical shape.

18. The super junction semiconductor device of claim 17, wherein each of the peripheral 15 pillars includes a plurality of lower peripheral cells stacked in the vertical direction, each having of a first diameter of a spherical shape, and a plurality of upper peripheral cells being connected to a topmost one of the lower peripheral cells, each having a second diameter of spherical shape smaller than the first diameter.

19. The super junction semiconductor device of claim 18, wherein the upper peripheral cells are stacked at least with two cells.

* * * * *